United States Patent
Noda et al.

(10) Patent No.: US 11,371,164 B2
(45) Date of Patent: Jun. 28, 2022

(54) COMPOUND SEMICONDUCTOR AND METHOD FOR PRODUCING SINGLE CRYSTAL OF COMPOUND SEMICONDUCTOR

(71) Applicant: JX NIPPON MINING & METALS CORPORATION, Tokyo (JP)

(72) Inventors: Akira Noda, Kitaibaraki (JP); Keita Kawahira, Kitaibaraki (JP); Ryuichi Hirano, Kitaibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 95 days.

(21) Appl. No.: 16/499,165

(22) PCT Filed: Nov. 9, 2017

(86) PCT No.: PCT/JP2017/040373
§ 371 (c)(1),
(2) Date: Sep. 27, 2019

(87) PCT Pub. No.: WO2018/179567
PCT Pub. Date: Oct. 4, 2018

(65) Prior Publication Data
US 2021/0108335 A1    Apr. 15, 2021

(30) Foreign Application Priority Data
Mar. 31, 2017 (JP) .............................. JP2017-072620

(51) Int. Cl.
C30B 15/14    (2006.01)
C30B 29/40    (2006.01)
(Continued)

(52) U.S. Cl.
CPC .............. *C30B 29/40* (2013.01); *C30B 15/14* (2013.01); *C30B 15/203* (2013.01); *C30B 27/02* (2013.01)

(58) Field of Classification Search
CPC ........ C30B 15/14; C30B 15/203; C30B 29/40
See application file for complete search history.

(56) References Cited

U.S. PATENT DOCUMENTS 6,043,548 A * 3/2000 Cahen ............... H01L 31/02963
257/102
7,095,923 B1 * 8/2006 Whiteaway ........ G02B 6/12016
385/14

(Continued)

FOREIGN PATENT DOCUMENTS

EP    1634981 A1    3/2006
JP    62-70298 A    3/1987

(Continued)

OTHER PUBLICATIONS

Extended European Search Report, dated Dec. 8, 2020, for corresponding European Application No. 17902761.0.

(Continued)

*Primary Examiner* — Robert M Kunemund
(74) *Attorney, Agent, or Firm* — Birch, Stewart, Kolasch & Birch, LLP

(57) ABSTRACT

Provided is a large diameter InP single crystal substrate having a diameter of 75 mm or more, which can achieve a high electrical activation rate of Zn over a main surface of the substrate even in a highly doped region having a Zn concentration of $5 \times 10^{18}$ cm$^{-3}$ or more; and a method for producing the same. An InP single crystal ingot is cooled such that a temperature difference of 200° C. is decreased for 2 to 7.5 minutes, while rotating the InP single crystal ingot at a rotation speed of 10 rpm or less, and the cooled InP single crystal ingot is cut into a thin plate, thereby allowing (Continued)

production of the InP single crystal substrate having an electrical activation rate of Zn of more than 85% over the main surface of the substrate even in a highly doped region having a Zn concentration of $5 \times 10^{18}$ cm$^{-3}$ or more.

7 Claims, 2 Drawing Sheets

(51) Int. Cl.
*C30B 15/20* (2006.01)
*C30B 27/02* (2006.01)

(56) References Cited

U.S. PATENT DOCUMENTS

| | | | |
|---|---|---|---|
| 2007/0101924 A1 | 5/2007 | Kawase | |
| 2008/0019896 A1 | 1/2008 | Noda et al. | |
| 2009/0072205 A1 | 3/2009 | Kawase | |
| 2014/0057423 A1* | 2/2014 | Tauzin | H01L 21/2654 |
| | | | 438/530 |
| 2016/0043248 A1 | 2/2016 | Noda et al. | |

FOREIGN PATENT DOCUMENTS

| | | |
|---|---|---|
| JP | 1-208396 A | 8/1989 |
| JP | 2-229796 A | 9/1990 |
| JP | 4-342498 A | 11/1992 |
| JP | 05-339100 A | 12/1993 |
| JP | 2000-327496 A | 11/2000 |
| JP | 2002-234792 A | 8/2002 |
| JP | 2008-120614 A | 5/2008 |
| JP | 2015-129091 A | 7/2015 |
| WO | WO 2004/106597 A1 | 12/2004 |
| WO | WO 2005/106083 A1 | 11/2005 |
| WO | WO 2014/156596 A1 | 10/2014 |

OTHER PUBLICATIONS

Hosokawa et al., "Development of 3-Inch-Diameter InP Single Crystals with Low Dislocation Density Using the VCZ Method", Sumitomo Electric Technical Review, No. 35, Jan. 1993, pp. 89-73.
International Preliminary Report on Patentability and Written Opinion of the International Searching Authority (Forms PCT/IB/338 and PCT/IPEA/409) for International Application No. PCT/JP2017/040373, dated Oct. 3, 2019, with an English translation.
Hirano el al., "Electrical characteristics of Zn in heavily doped InP grown by the liquid-encapsulated Czochralski technique", J. Appl. Phys., Jan. 15, 1992, vol. 71, No. 2, pp. 659-663.
Hirano et al., "Reduction of Dislocation Densities in InP Single Crystals by the LEC Method Using Thermal Baffles", Journal of Electronic Materials, 1996, vol. 25, No. 3, pp. 347-351.
International Search Report for PCT/JP2017/040373 dated Jan. 23, 2018.

* cited by examiner

[FIG. 1]
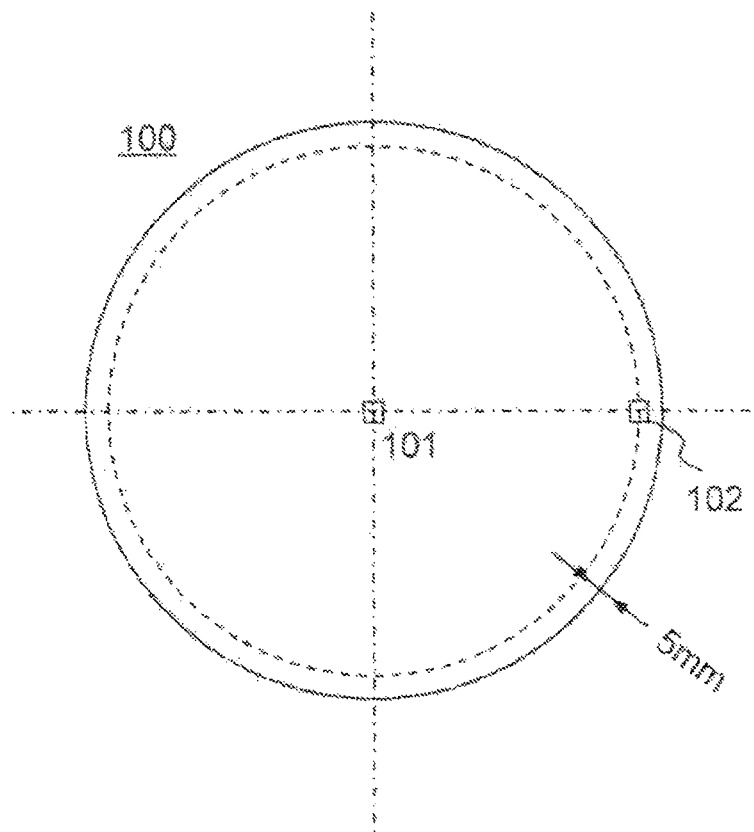

[FIG. 2]
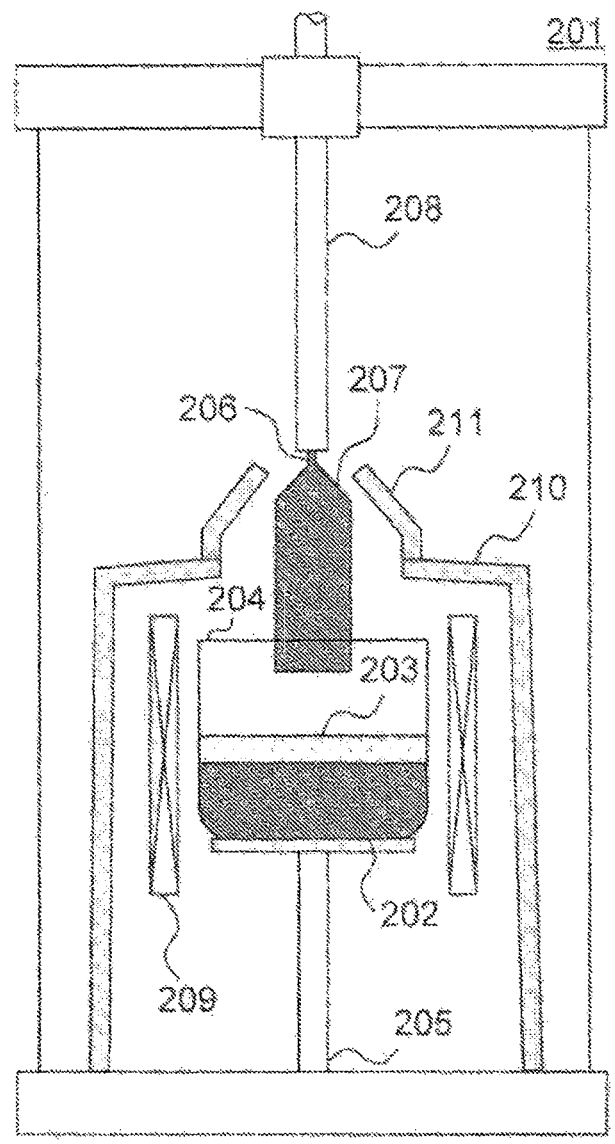

COMPOUND SEMICONDUCTOR AND METHOD FOR PRODUCING SINGLE CRYSTAL OF COMPOUND SEMICONDUCTOR

TECHNICAL FIELD

The present invention relates to an indium phosphide (InP) single crystal which is a compound semiconductor and a method for producing the same. More particularly, the present invention relates to an InP single crystal substrate in which, in an InP single crystal doped with zinc (Zn) suitable as a p-type dopant, carriers having the doped zinc contributing to electrical conduction can be effectively and uniformly generated in a semiconductor; and a method for producing the same.

BACKGROUND ART

Indium phosphide (InP) also called indium phosphorus is a group III-V compound semiconductor material composed of indium (In) of group III and phosphorus (P) of group V. As the semiconductor material, the InP has characteristics of a band gap of 1.35 eV, and an electron mobility up to 500 $cm^2/V \cdot s$, which is a higher electron mobility under high electric field than other general semiconductor materials such as silicon and gallium arsenide. Further, the InP is characterized in that a stable crystal structure under normal temperature and pressure is a cubic zinc blende structure, and its lattice constant is larger than that of a compound semiconductor such as gallium arsenide (GaAs) and gallium phosphide (GaP).

Single crystal InP has a higher electron mobility than silicon (Si) and the like, and it is, therefore, used as a material for high-speed electronic devices utilizing the higher mobility. Further, the single crystal InP has a larger lattice constant than that of gallium arsenide (GaAs) or gallium phosphide (GaP), which can decrease a lattice mismatch rate in heteroepitaxial growth of a ternary mixed crystal such as InGaAs and quaternary mixed crystal such as InGaAsP. Therefore, the single crystal InP is used for various optical communication devices such as semiconductor lasers, optical modulators, optical amplifiers, optical waveguides, light emitting diodes, and light receiving elements, which form those mixed crystal compounds as a laminated structure, and is used as a substrate for compound optical integrated circuits thereof.

To form the various devices as described above, an InP single crystal ingot is cut into a thin plate (wafer) in a predetermined crystal orientation to form an InP substrate which is used to form the device. For production of the InP single crystal ingot that is a base for the substrate, prior arts conventionally use means such as a vertical Bridgman method (VB method) as disclosed in Patent Document 1 or 2; a vertical temperature gradient freezing method (VGF method) as disclosed in Patent Document 3, and a liquid encapsulated Czochralski method (LEC method) as disclosed in Patent Documents 4 and 5 or Non-Patent Documents 1 and 2.

In the VB method or the VGF method, a temperature gradient is formed in a direction perpendicular to a raw material melt maintained in a vessel, and a freezing point (melting point) of a crystal is continuously moved in a vertical direction by moving any one of temperature distributions of the vessel or a furnace in the vertical direction, to grow a single crystal continuously in the vertical direction inside the vessel. In the VB method and the VGF method, the temperature gradient set at a solid-liquid interface in the vertical direction can be decreased and an average crystal dislocation density can be suppressed at a lower level. However, the VB method and the VGF method have problems that a crystal growth rate is relatively slow and productivity is low, as well as has disadvantages that since it is crystal growth in the vessel, a region having locally higher dislocation density is generated due to stress acting from the vessel as the crystal grows, and the like.

On the other hand, the LEC method is a modification of the Czochralski method (CZ method) which is widely used as a general producing method for a large-sized silicon single crystal. In the LEC method, a gas-liquid interface portion on a surface of a raw material melt for pulling up a single crystal is covered with a liquid encapsulating agent such as boron oxide ($B_2O_3$) or the like having a low softening point temperature, and a seed crystal is brought into contact with the raw material melt while preventing dissipation due to evaporation of volatile components in the raw material melt, to pull up and grow a single crystal ingot. In the LEC method, the temperature gradient formed at the solid-liquid interface between the melt and the pulled crystal is generally larger than the VB method and the VGF method as described above, and the dislocation density tends to be increased, but it is characterized by a higher crystal growth speed, which is suitable for mass production. Further, to cure the disadvantages as stated above, Patent Documents 4 and 5 and Non-Patent Document 1 disclose an improved LEC method called a thermal baffle LEC (TB-LEC) method, which provides a partition wall having a heat shielding effect above a melt holding vessel, in order to improve controllability of the temperature gradient of the solid-liquid interface during the crystal growth in the LEO method.

The InP single crystal is a semiconductor showing an n-conduction type having a carrier density of about $10^{16}$ $cm^{-3}$ in a non-doped state. To use the InP single crystal for the various device applications as described above, it is used as a material intentionally doped with a dopant element(s) in order to control the conduction type and the carrier density. As the dopant, iron (Fe) is used for a semi-insulating property, and silicon (Si), sulfur (S), tin (Sn) or the like is used for providing the n type having a high carrier concentration, and Zinc (Zn) is suitably used for providing the p type.

Thus, Zn is often used as a dopant for obtaining the p-type InP single crystal. However, when Zn is used as a p-type dopant for InP, particularly when an InP single crystal having high carrier density and low resistivity is to be obtained in a highly doped region that exceeds $5 \times 10^{18}$ $cm^{-3}$, a problem is known that a proportion of doped Zn which does not contribute to carrier generation is increased so that the carrier density cannot be set to a higher level to be intended, as disclosed in Non-Patent Document 2.

Non-Patent Document 2 discloses that a carrier density comparable to the Zn concentration can be realized as long as the Zn concentration doped in InP is up to about $3 \times 10^{18}$ $cm^{-3}$, whereas as the Zn concentration is more than $3 \times 10^{18}$ $cm^{-3}$, the carrier concentration is not increased correspondingly even if the Zn concentration is increased, so that the carrier density tends to be saturated. This tendency becomes remarkable from the concentration around the Zn concentration of more than $5 \times 10^{18}$ $cm^{-3}$. Non-Patent Document 2 discloses that the decrease in the carrier concentration can be improved by increasing a cooling rate after a heat treatment of the single crystal, and that the InP single crystal ingot after the LEC growth can be improved by using fast cooling as cooling in a furnace after the crystal growth.

CITATION LIST

Patent Literatures

Patent Document 1: WO 2004/106597 A1
Patent Document 2: Japanese Patent Application Publication No. 2008-120614 A
Patent Document 3: Japanese Patent Application Publication No. 2000-327496 A
Patent Document 4: WO 2005/106083 A1
Patent Document 5: Japanese Patent Application Publication No. 2002-234792 A1 Non-Patent Literatures
Non-Patent Document 1: R. Hirano et al., J. Appl. Phys., vol. 71 (1992), pp. 659-663
Non-Patent Document 2: R. Hirano and M. Uchida, J. Electron. Mater, vol. 25 (1996), pp. 347-351

SUMMARY OF INVENTION

Technical Problem

As described above, Non-Patent Document 2 generally teaches that the problem that in the Zn-doped InP single crystal, the proportion of the doped Zn contributing to carrier generation (an electrical activation rate of Zn) is lowered in the highly doped region is effectively addressed by perform the fast cooling in the furnace after producing the InP single crystal with the LEC method. However, this document does not disclose any specific cooling rate or specific operation during the cooling, nor teach any specific configuration of the furnace for LEC.

Recently, there is also an increasing need for an InP single crystal substrate having a larger diameter and uniform characteristics in order to improve a production yield in the production of a device. In the Zn-doped InP single crystal substrate, the electrical activation rate of Zn is an important index directly connected to electrical characteristics of the substrate. Therefore, Zn is of course required to be electrically activated uniformly in plane of the substrate. Non-Patent Document 2 described above mentions the improvement of the electrical activation rate of Zn in the InP ingot, but it does not disclose uniformity of the electrical activation rate of Zn in plane of the substrate which is formed by cutting out the ingot.

On the other hand, Patent Document 1 and Patent Document 2 discuss that in the compound semiconductor single crystal substrate of InP or the like doped with a predetermined dopant, the uniformity of the dopant concentration and the carrier density in plane of the substrate is suppressed within a certain range. However, these prior art documents do not recognize the problem of the decrease in the electrical activation rate of Zn, which is inherent in the case where the InP is doped with Zn, as discussed in Non-Patent Document 2, let alone the problem about the uniformity of the electrical activation rate Zn in plane of the substrate.

In view of those problems of the prior arts, the present invention provide a Zn-doped InP single crystal substrate having a higher electrical activation rate of Zn at a total of two measurement points: a point at a center on a surface of a wafer-shaped substrate and an arbitrary point on a circumference, which is more inside by 5 mm than an outer periphery of the wafer, even in a highly doped region having a Zn concentration of $5 \times 10^{18}$ cm$^{-3}$ or more in a large-diameter InP single crystal substrate having a diameter of 75 mm or more. Another object of the present invention is to provide a method for producing a Zn-doped InP single crystal substrate having a large diameter and a high electrical activation rate of Zn as described above.

Solution to Problem

As a result of intensive studies by the present inventors to solve the above technical problems, the present inventors have found that by processing an InP single crystal ingot under specific appropriate conditions after crystal growth in the LEC method, an electrical activation rate of Zn of more than 85% can be realized at a total of two measurement points: a point at a center of a surface of a wafer-shaped substrate and an arbitrary point on a circumference, which is more inside by 5 mm than an outer periphery of the wafer, even in a highly doped region having a Zn concentration of $5 \times 10^{18}$ cm$^{-3}$ or more in a large-diameter InP single crystal substrate having a diameter of 75 mm or more, and further variations in the electrical activation rate of Zn on a main surface of the wafer-shaped substrate can be reduced to 15% or less.

Based on the findings and results as described above, the present invention provides the following inventions:

1)
A Zn-doped InP single crystal substrate having a diameter of 75 mm or more and a Zn concentration of $5 \times 10^{18}$ cm$^{-3}$ or more, wherein the Zn-doped InP single crystal substrate has an electrical activation ratio of Zn of more than 85% at a total of two measurement points: a point at a center of a surface of a wafer-shaped substrate and an arbitrary point on a circumference which is more inside by 5 mm than an outer periphery of the wafer.

2)
The Zn-doped InP single crystal substrate according to 1), wherein the Zn-doped single crystal substrate has a variation in electrical activation rate of Zn of 15% or less on a main surface of the substrate.

3)
The Zn-doped InP single crystal substrate according to 1) or 2), wherein the Zn-doped InP single crystal substrate has an average dislocation density of 500 cm$^{-2}$ or less on the main surface of the substrate.

4)
A method for producing the Zn-doped InP single crystal substrate according to any one of 1) to 3), the method comprising: cooling an InP single crystal ingot such that a temperature difference of 200° C. is decreased for 2 to 7.5 minutes, while rotating the InP single crystal ingot at a rotation speed of 10 rpm or less; and cutting the cooled InP single crystal ingot into a thin plate to form an InP single crystal substrate.

5)
The method according to 4), wherein the cooling of the InP single crystal ingot comprises moving a growth crucible away from a heating portion of a heater.

6)
The method according to 4) or 5), wherein the cooling of the InP single crystal ingot further comprises moving the growth crucible down to the lowermost portion in a furnace in order to move the crucible away from the heating portion of the heater.

7)
The method according to any one of 4) to 6), further comprising pulling up the Zn-doped InP single crystal ingot in a furnace by a liquid encapsulated Czochralski method, the furnace comprising a thermal baffle, the thermal baffle having a structure in which a conical cylinder is directly connected to an upper wall of a straight body-shaped cylinder made of graphite and having a thickness of from 3 to 6 mm.

8)

The method according to 7), wherein the cooling of the InP single crystal ingot further comprises cooling the InP single crystal ingot on an inner side of the thermal baffle and without bringing the InP single crystal ingot into contact with the thermal baffle, while rotating the InP single crystal ingot, after pulling up the InP single crystal ingot by the LEC method.

Advantageous Effects of Invention

According to the present invention, an electrical activation rate of Zn of more than 85% can be realized at a total of two measurement points: a point at a center of a surface of a wafer-shaped substrate and an arbitrary point on a circumference which is more inside by 5 mm than an outer periphery of the wafer, even in a highly doped region having a Zn concentration of $5 \times 10^{18}$ cm$^{-3}$ or more in a large-diameter InP single crystal substrate, so that devices having fixed characteristics over the entire surface of the substrate can be designed and produced, and effects such as improvement of production yield, and hence labor saving and cost reduction can be obtained.

BRIEF DESCRIPTION OF DRAWINGS

FIG. 1 shows measurement positions for an electrical activation rate of Zn (carrier concentration, Zn concentration) on a wafer surface.

FIG. 2 shows an example of a Zn-doped InP single crystal production apparatus used in the present invention.

DESCRIPTION OF THE PREFERRED EMBODIMENTS

A Zn-doped InP single crystal substrate according to the present invention has a Zn concentration of $5 \times 10^{18}$ cm$^{-3}$ or more and an electrical activation rate of Zn of more than 85% or more at a central portion of a main surface of the substrate and at a portion more inside by 5 mm than an outer periphery of the wafer. The substrate has a circular or substantially circular thin plate (wafer) shape, and the "main surface" as used herein refers to the largest area of the outer surface of the substrate. The substrate has a diameter of 75 mm or more, and preferably 75 mm or more and 100 mm or less, but it may have a diameter of 100 mm or more. As used herein, the InP single crystal substrate having a Zn concentration of $5 \times 10^{18}$ cm$^{-3}$ or more may be a single crystal produced by adjusting an amount of Zn added in a melt such that a single crystal substrate having a predetermined diameter can be obtained from an upper part of the single crystal, or may be a single crystal grown such that although the Zn concentration is lower than $5 \times 10^{18}$ cm$^{-3}$ on the upper part of the single crystal, the Zn concentration of the InP single crystal substrate obtained from an growth intermediate portion or a growth later portion of the single crystal, which will be a portion having a high crystal solidification rate, is $5 \times 10^{18}$ cm$^{-3}$ or more.

The "electrical activation rate of Zn" as used herein is calculated as a value expressing a ratio of a carrier density to a concentration of Zn doped in InP as a percentage (%). A doped concentration $N_{Zn}$ of Zn in the InP single crystal substrate can be analyzed and evaluated by secondary ion mass spectrometry (SIMS), and in the case of the Zn-doped InP, the carrier density $N_A$ will be a value substantially corresponding to a hole density, which can be evaluated by a Hall measurement method. The electrical activation rate of Zn can refer to a proportion of a doped Zn that produces carriers contributing to charge transport, among the doped Zn elements, and is a value calculated by $(N_A/N_{Zn}) \times 100(\%)$. The major feature of the substrate according to the present invention is that the value of the electrical activation rate of Zn is more than 85% at a total of two measurement points: a point at a center of a surface of the wafer-shaped substrate of the substrate and a point on a circumference which is more inside by 5 mm than an outer periphery of the wafer. The value of the electrical activation rate of Zn may preferably be more than 90% at a total of two measurement points: the point at the center of the surface of the wafer-shaped substrate and the point on the circumference which is more inside by 5 mm than the outer periphery of the wafer, and more preferably more than 95%.

Further, a variation in electrical activation rate of Zn on the main surface of the substrate is preferably 15% or less, and more preferably 10% or less. The "variation in electrical activation rate of Zn" as used herein is determined by measuring the above Zn concentration and carrier concentration at two measurement points: a point 101 at the center on a surface of a wafer-shaped substrate 100 and a point 102 on a circumference which is more inside by 5 mm than the outer periphery of the wafer, and is expressed as a percentage (%) of an absolute value of a difference between the electrical activation rates of Zn calculated for the two points to an average value at the two points, as shown in FIG. 1. In general wafer-shaped InP substrates, various characteristics including the electrical activation rate of Zn show different tendencies between the central portion and the peripheral portion of the wafer. Therefore, the evaluation of a variation in a characteristic such as the electrical activation rate of Zn at the two measurement points: the point 101 at the center of the surface of the wafer-shaped substrate 100 and the point 102 on the circumference which is more inside by 5 mm than the outer periphery of the water can provide an approximate indicator of uniformity of the characteristic in the entire in-plane of the substrate.

In addition, an average dislocation density of the Zn-doped InP single crystal substrate according to the present invention is 500 cm$^{-2}$ or less, and preferably 300 cm$^{-2}$ or less, but depending on a site in which the substrate is taken out from the ingot, it may be 100 cm$^{-2}$ or less, or 50 cm$^{-2}$ or less, or further 20 cm$^{-2}$ or less. The dislocation density can be evaluated by observation of etch pits well-known and commonly used in the art. In the present invention, the dislocation density is evaluated by calculating a weighted average value obtained by weighting an area in the radial direction to the number of etch pits per unit area at each measurement point taken at 5 mm pitch from the wafer center.

Next, an effective production method for obtaining the Zn-doped InP single crystal substrate according to the present invention will be described. The Zn-doped InP single crystal substrate itself according to the present invention is not limited by any production method, and it may be produced by any production method. For example, it is also applicable to a case where a thermal baffle as in the present invention is placed on an upper portion of a crucible and a single crystal is grown in the VB method or the VGF method. However, effective examples of means for realizing the above characteristics include production of a single crystal ingot by a TB-LEC (Thermal Baffle-LEC) method as described below and processing of the single crystal ingot under specified conditions.

FIG. 2 is a schematic view showing an example of an apparatus suitable for producing the Zn-doped InP single crystal according to the present invention. The structure of the apparatus is common in crystal growth by a liquid encapsulated Czochralski (LEC) method, with the exception of a structure of a thermal baffle present in an upper space as described below. The apparatus includes: a crucible 204 for maintaining a raw material 202 and a liquid encapsulating agent 203 in a growth vessel 201; a crucible support shaft 205 that enables rotation while holding the crucible; a pulling-up shaft 208 that pulls up a seed crystal 206 and a grown InP single crystal 207 while rotating them; a heater 209 surrounding an outer periphery of the crucible and heating the raw material, the liquid encapsulating agent and the like in the crucible; and a graphite member 210 surrounding a configuration including the heater and the crucible on an outer side of the heater.

Further, in a space where the InP single crystal ingot pulled up from the raw material melt at an upper portion of the crucible is present, a hood-shaped thermal baffle 211 made of graphite is disposed on an upper portion of a set of the graphite member 210 surrounding the crucible, heater and the like. The thermal baffle plays a role of appropriately shielding heat from the heater around the crucible to adjust a temperature gradient in a pulling-up axis direction at a solid-liquid interface during pulling-up of the single crystal, thereby enabling suppression of dislocation, as disclosed in the prior art documents (see Patent Document 5, Non-Patent Document 1, and the like). In addition, according to the present invention, the thermal baffle plays an important role even after pulling up the InP single crystal ingot. The inner side of the furnace immediately after the pulling-up of the single crystal is still in a state where the pulled single crystal ingot is subjected to a thermal load due to radiant heat from the heater, the melt or the inner wall surface of the apparatus. However, appropriately shaping the thermal baffle can allow appropriate shielding of the thermal load received by the single crystal ingot after being pulled up.

The Zn-doped InP single crystal having a diameter of 75 mm or more is pulled up by the LEC method using a thermal baffle-attached LEC (TB-LEC) pulling-up apparatus having such arrangement. The raw material melt is obtained by directly adding to an InP polycrystalline raw material synthesized by a horizontal bridgman (HB) method or the like an elemental Zn in an amount such that a Zn concentration is a target numerical value, and a low temperature softening oxide such as boron ($B_2O_3$) as a component for the liquid encapsulating agent is placed in the crucible and melted by heating to obtain a liquid encapsulating agent layer. In addition to P, the dopant element Zn is also a component that has a relatively high vapor pressure and is easily vaporized. However, the use of the liquid encapsulating agent and vapor pressure control in the baffle can allow direct doping of Zn without previously synthesizing a mother alloy in which InP polycrystalline is doped with Zn, thereby omitting some steps in the process. The direct doping is also advantageous in that the Zn concentration can be flexibly and finely adjusted.

The seed crystal is immersed in the molten raw material and the seed crystal is gradually pulled up, whereby the InP single crystal is pulled up. The pulling-up of the InP single crystal by the LEC method can be performed according to conditions that are normally applied. For example, the pulling-up can be carried out under conditions of a pulling rate of from 5 to 20 mm/hr, a crystal rotation speed of from 5 to 30 rpm, a crucible rotation speed of from 5 to 30 rpm, a melt temperature of from 1060 to 1300° C., and a temperature gradient of from 1 to 50° C./cm in the pulling-up axis direction, which may modified as needed. Further, to prevent dissociation and volatilization of P, Zn and the like which are high vapor pressure components, the space in the baffle is controlled in a pressurized stated of 4 MPa or more in an inert atmosphere during pulling-up of the single crystal.

The pulling-up of the InP single crystal is completed after forming a shoulder portion and a straight body portion from the seed crystal, then forming a tail portion, and then separating the single crystal ingot from the melt. In the growth of ordinary InP single crystals, after forming the tail portion and then separating the single crystal ingot from the melt, the single crystal ingot may be gradually cooled to room temperature over a period of several hours (from about 4 to 8 hours). However, in the present invention, the single crystal ingot is rapidly cooled after growing the single crystal without performing the gradual cooling. The rapid cooling of the single crystal ingot can maintain a higher electrical activation rate of Zn even in such a highly doped region that the Zn concentration is $5 \times 10^{18}$ $cm^{-3}$ or more.

At this time, the single crystal ingot is cooled such that a temperature difference of 200° C. monitored by a thermocouple at the bottom of the crucible is decreased over a period of from 2 minutes to 7.5 minutes. Preferably, either 1100° C. or 1050° C. or 1020° C. is determined as a reference, and in the region up to a temperature of 200° C. below the reference, the cooling can be carried out at an average cooling rate of 50° C./min or more, or 60° C./min or more, or 70° C./min or more. This can allow a high electrical activation ratio of Zn of 85% or more to be achieved in such a highly doped region that $5 \times 10^{18}$ $cm^{-3}$ or more. However, if the cooling rate of the single crystal ingot is excessively increased, thermal stress due to the rapid cooling will occur to generate cracks in the crystal, which may lead to accidents such as falling of the ingot and damage of the equipment accompanied therewith, as well as uniform cooling of the ingot will be difficult so that there is a risk that the variation in the electrical activation rate of Zn may be deteriorated, which are not preferable. From such a viewpoint, an upper limit of the cooling rate of the single crystal ingot is 100° C./min, and in another embodiment it may be 90° C./min.

In the single crystal ingot pulled up by the LEC method, heat removal from the pulling-up shaft holding the seed crystal is dominant in view of the form of crystal growth and the physical configuration of the crystal growth apparatus. On the other hand, the outer peripheral portion of the single crystal ingot is exposed to a residual radiation from the heater and the apparatus wall which have large heat capacity, the melt and the like, so that it is still subjected to a predetermined heat load even after the end of the pulling-up. Therefore, the single crystal ingot after being pulled up tends to form a cooling rate distribution which is higher at a central axis and lower at the outer peripheral portion of the ingot. Therefore, if the ingot is cooled in this state, the cooling rate will be different between the vicinity of the center portion and the vicinity of the outer peripheral portion in plane perpendicular to the pulling-up axis of the single crystal ingot. Since the cooling rate is a factor that greatly affects the electrical activation rate of Zn in the high Zn-doped region, the difference in the cooling rates between the vicinity of the central portion and the vicinity of the outer peripheral portion will be reflected as a distribution of the electrical activation rate of Zn. That is, even if the high Zn-doped region after being pulled up is simply subjected to the rapid cooling, it is difficult to achieve any uniform electrical activation rate of Zn in plane perpendicular to the pulling-up axis of the ingot, due to the cooling rate difference occurring between the central axis and the outer peripheral portion.

Therefore, in the present invention, the above rapid cooling process of the InP single crystal ingot is carried out in a state where the space in the baffle holding the single crystal ingot is filled with an inert gas such as nitrogen and a rare gas and the single crystal ingot is continuously rotated. This can allow facilitation of the cooling of the single crystal ingot from the outer peripheral portion, and alleviation of the cooling rate difference between the vicinity of the center portion and the vicinity of the outer peripheral portion in plane perpendicular to the pulling-up axis as described above. Furthermore, as a means for facilitating the rapid cooling, a treatment for moving the crucible away from the position of the heating portion of the heater can be carried out. This can allow suppression of a decrease in the cooling rate due to radiant heat (residual heat) from contents such as a part of the raw material remaining in the crucible and the liquid encapsulating agent.

Further, the rotation speed of the single crystal ingot during the cooling is preferably 10 rpm or less, and more preferably 1 to 5 rpm. By optimizing these conditions and further the shape of the thermal baffle around the single crystal ingot as described above, the cooling rates in the pulling-up axis of the single crystal ingot and in the outer peripheral portion can be made uniform, thereby enabling a high and uniform electrical activation rate of Zn in the high Zn-doped region, more particularly an electrical activation rate of Zn of 85% or more in the entire area of the in-plane cut out in the direction perpendicular to the ingot axis.

The InP single crystal ingot after the cooling process is cut into a thin plate, which is subjected to ordinary wafer processing steps such as lapping, mirror polishing, and cleaning to form a substrate which can be used for applications such as device production.

EXAMPLES

Hereinafter, the present invention will be specifically described based on Examples and Comparative Examples. The descriptions of Examples and Comparative Examples as described below are merely specific examples for facilitating understanding of the technical contents of the present invention and the technical scope of the present invention is not limited by these specific examples.

Example 1

A Zn-doped InP single crystal was pulled up using the single crystal production apparatus shown in FIG. 1. First, 2400 g of InP polycrystal synthesized by the HB method as a raw material and 0.34 g of Zn as a dopant were weighed, and a mixture of these were introduced into a crucible, and 400 g of $B_2O_3$ as a liquid encapsulating agent was placed thereon. In a space above the crucible, a graphite thermal baffle was disposed that had a thickness of from 2 to 6 mm and had a structure in which a conical hood-shaped configuration extended from a cylindrical straight body-shaped upper wall.

After closing a growth vessel, the inside of the vessel was temporarily evacuated, and nitrogen gas ($N_2$) as an inert gas was then introduced to pressurize the inside of the vessel to a pressure of 2 MPa or more. In this state, power supply to the heater was started to heat the crucible. Once the temperature inside the crucible reached about 450° C., $B_2O_3$ as the liquid encapsulating agent melted (softened), and once the heating was continued and the temperature reached about 1060° C., the InP polycrystal as the raw material melted. Once the InP polycrystalline raw material and the liquid encapsulating agent melted, the temperature of the melt was controlled by appropriately adjusting the heater.

A seed crystal in which a pulling-up axis direction from an upper side of the melt in the crucible was [100] orientation was immersed and the InP single crystal was pulled up. A diameter of the straight body portion at the time of pulling-up in Example 1 was 75 mm (3 inches), a pulling rate was 7 mm/hr, a crucible rotation speed was 15 rpm, a seed crystal rotation speed was 20 rpm, and a temperature gradient in the pulling-up direction at the crystal growth interface was 30° C./cm by controlling the heater.

After growing the straight body portion to 40 mm, a tail portion forming process was carried out to separate the pulled single crystal ingot from the melt. Immediately after the separation, power supply to the heater was stopped and a cooling process was started. In this case, the single crystal ingot was maintained in a thermal baffle at such a position that the single crystal ingot was not brought into contact with the baffle, and the position of the crucible was moved down from the position near the heat generation portion of the heater to a most lower position (the lowest position) that could adjust the position in the crucible, thereby avoiding the impact of radiant heat due to residual heat from the crucible. The single crystal ingot was then maintained in a nitrogen gas atmosphere under a pressure of 4 MPa or more while continuously rotating it at 3 rpm. Thus, the cooling rate of the entire crystal was 70° C./min on average in the temperature range of from 1020° C. immediately after the start of the cooling process to 820° C.

After cooling it to room temperature, the straight body portion of the single crystal ingot was cut into a thin plate in a direction perpendicular to the pulling-up axis to form a wafer-shaped substrate, which was subjected to measurement for each of a Zn concentration, carrier (hole) density and dislocation density in the main surface of the substrate. From the results, an electrical activation rate of Zn and its in-plane variation were evaluated. The measurement method of each characteristic and the definition of the in-plane variation were evaluated in accordance with the above descriptions.

As a result, the Zn concentration at the central portion of the wafer was $5.5 \times 10^{18}$ cm$^{-3}$, the electrical activation rate of Zn was 87.9%, the Zn concentration at the point that was more inside by 5 mm than the outer periphery of the wafer was $6.0 \times 10^{18}$ cm$^{-3}$, the electrical activation rate of Zn was 86.5%, and the in-plane variation in the electrical activation rate of Zn was 1.6%. The average dislocation density of the substrate was 19 cm$^{-2}$. Thus, in Example 1, the electrical activation rate of Zn of 85% or more was achieved over the entire main surface of the substrate.

Example 2

In the same method as that of Example 1, a Zn-doped InP single crystal having a diameter of 75 mm (3 inches) in a straight body portion was pulled up. Immediately after growth of a single crystal ingot, power supply to the heater was stopped and the cooling step was started by rapidly moving down the crucible to a position corresponding to a lower side than a heating center position of the heater in the furnace (a middle lower portion). In this case, the single crystal ingot was maintained within the thermal baffle at such a position that the single crystal ingot was not brought into contact with the baffle, and held in a nitrogen gas atmosphere under a pressure of 4 MPa or more while continuously rotating the ingot at 3 rpm. Thus, the cooling rate of the entire crystal was 50° C./min on average in a temperature range of from 1020° C. immediately after the start of the cooling step to 820° C.

As a result, the Zn concentration at the central portion of the wafer was $5.3 \times 10^{18}$ cm$^{-3}$, the electrical activation rate of Zn was 89.6%, the Zn concentration at the point that was more inside by 5 mm than the outer periphery of the wafer was $5.9 \times 10^{18}$ cm$^{-3}$, the electrical activation rate of Zn was 87.1%, and the in-plane variation in the electrical activation rate of Zn was 2.8%. The average dislocation density of the substrate was 42 cm$^{-2}$. Thus, also in Example 2, the electrical activation rate of Zn of 85% or more was achieved over the entire main surface of the substrate.

Example 3

In the same method as that of Example 1, a Zn-doped InP single crystal having a diameter of 75 mm (3 inches) in a straight body portion was pulled up. Immediately after growth of a single crystal ingot, power supply to the heater was stopped and the cooling step was started. In this case, the single crystal ingot was maintained within the thermal baffle at such a position that the single crystal ingot was not brought into contact with the baffle, and the position of the crucible was moved down from a position near a heating position of the heater at the time of growth of the single crystal to a lower portion within the furnace. In this case, the crucible was moved down to an upper position than that in the cooling step of Example 1 and a lower position than that of Example 2 to avoid the impact of radiant heat due to residual heat from the crucible. The single crystal ingot was then held in a nitrogen gas atmosphere under a pressure of 4 MPa or more while continuously rotating the ingot at 3 rpm. Thus, the cooling rate of the entire crystal was 65° C./min on average in a temperature range of from 1020° C. immediately after the start of the cooling step to 820° C.

As a result, the Zn concentration at the central portion of the wafer was $5.4 \times 10^{18}$ cm$^{-3}$, the electrical activation rate of Zn was 87.7%, the Zn concentration at the point that was more inside by 5 mm than the outer periphery of the wafer was $5.7 \times 10^{18}$ cm$^{-3}$, the electrical activation rate of Zn was 85.2%, and the in-plane variation in the electrical activation rate of Zn was 2.8%. The average dislocation density of the substrate was 30 cm$^{-2}$. Thus, also in Example 3, the electrical activation rate of Zn of 85% or more was achieved over the entire main surface of the substrate.

Comparative Example 1

In the same method as that of Example 1, a Zn-doped InP single crystal having a diameter of 50 mm (2 inches) in a straight body portion was pulled up. In Comparative Example 1, the single crystal ingot was cooled by gradual cooling from 1050° C. to 500° C. over 5 hours after the separation step. Thus, the cooling rate of the entire crystal was 20° C./min on average in a temperature range of from 1020° C. immediately after the start of the cooling step to 820° C.

As a result, the Zn concentration at the central portion of the wafer was $5.1 \times 10^{18}$ cm$^{-3}$, the electrical activation rate of Zn was 75.0%, the Zn concentration at the point that was more inside by 5 mm than the outer periphery of the wafer was $5.5 \times 10^{18}$ cm$^{-3}$, the electrical activation rate of Zn was 63.2%, and the in-plane variation in the electrical activation rate of Zn was 17.1%. The average dislocation density of the substrate was 40 cm$^{-2}$. Thus, in Comparative Example 1, the electrical activation rate of Zn of 85% or more was not achieved over the entire main surface of the substrate.

Comparative Example 2

In the same method as that of Example 1, a Zn-doped InP single crystal having a diameter of 50 mm (2 inches) in a straight body portion was pulled up. In Comparative Example 2, the power supply to the heater was stopped immediately after the separation step, and the cooling step was carried out without moving down the crucible. Thus, the cooling rate of the entire crystal was 25° C./min on average in a temperature range of from 1020° C. immediately after the start of the cooling step to 820° C.

As a result, the Zn concentration at the central portion of the wafer was $5.2 \times 10^{18}$ cm$^{-3}$, the electrical activation rate of Zn was 76.0%, the Zn concentration at the point that was more inside by 5 mm than the outer periphery of the wafer was $5.5 \times 10^{18}$ cm$^{-3}$, the electrical activation rate of Zn was 65.2%, and the in-plane variation in the electrical activation rate of Zn was 15.3%. The average dislocation density of the substrate was 42 cm$^{-2}$. Thus, in Comparative Example 2, the electrical activation rate of Zn of 85% or more was not achieved over the entire main surface of the substrate.

| | | Cooling | | | Wafer Central Portion | | Wafer Outer Periphery (5 mm inside) | | Activation Rate In-Plane Variation (%) | Dislocation Density (cm$^{-2}$) |
|---|---|---|---|---|---|---|---|---|---|---|
| | Crystal Diameter (inch) | Rate (° C./min) (1020 → 820° C.) | Gradual Cooling | Crucible Moving Down | Zn Concentration (cm$^{-3}$) | Activation Rate (%) | Zn Concentration (cm$^{-3}$) | Activation Rate (%) | | |
| Example 1 | 3 | 70 | Non | Lowest | $5.5 \times 10^{18}$ | 87.9 | $6.0 \times 10^{18}$ | 86.5 | 1.6 | 19 |
| Example 2 | 3 | 50 | Non | Middle Lower | $5.3 \times 10^{18}$ | 89.6 | $5.9 \times 10^{18}$ | 87.1 | 2.8 | 42 |
| Example 3 | 3 | 65 | Non | Lower | $5.4 \times 10^{18}$ | 87.7 | $5.7 \times 10^{18}$ | 85.2 | 2.9 | 30 |
| Comparative Example 1 | 2 | 20 | Yes | Non | $5.1 \times 10^{18}$ | 75.0 | $5.5 \times 10^{18}$ | 63.2 | 17.1 | 40 |
| Comparative Example 2 | 2 | 25 | Non | Non | $5.2 \times 10^{18}$ | 76.0 | $5.5 \times 10^{18}$ | 65.2 | 15.3 | 42 |

INDUSTRIAL APPLICABILITY

The present invention can provide a Zn-doped InP single crystal substrate that has a high efficiency and high accuracy and is uniformly activated in plane of the substrate even if the doped Zn has a high concentration, which substrate is utilized for various optical communication devices such as semiconductor lasers, optical modulators, optical amplifiers, optical waveguides, light emitting diodes and light receiving elements, and is used as a substrate for compound optical integrated circuits thereof. Therefore, the present invention can allow design and production of devices having uniform characteristics over the entire surface of the substrate with high accuracy, and significant contribution to the field of semiconductor device production in terms of improvement of production yield, and hence labor saving and cost reduction.

What is claimed is:

1. A Zn-doped InP single crystal substrate having a diameter of 75 mm or more and a Zn concentration of $5 \times 10^{18}$ cm$^{-3}$ or more, wherein a dopant in the Zn-doped InP single crystal substrate is only Zn, and
    wherein the Zn-doped InP single crystal substrate has an electrical activation rate of Zn of 87.7% or more at a point at a center of a surface of a wafer-shaped substrate and an electrical activation rate of Zn of 85.2% or more at an arbitrary point on a circumference which is more inside by 5 mm than an outer periphery of the wafer,
    wherein the Zn-doped single crystal substrate has an in-plane variation in electrical activation rate of Zn of 2.9% or less on a main surface of the substrate.

2. The Zn-doped InP single crystal substrate according to claim 1, wherein the Zn-doped InP single crystal substrate has an average dislocation density of 100 cm$^{-2}$ or less on the main surface of the substrate.

3. A method for producing the Zn-doped InP single crystal substrate according to claim 1, the method comprising:
    cooling an InP single crystal ingot such that a temperature difference of 200° C. in a range of 1020° C. to 820° C. is decreased at an average cooling rate of 50° C./min or more, while rotating the InP single crystal ingot at a rotation speed of 10 rpm or less; and
    cutting the cooled InP single crystal ingot into a thin plate to form an InP single crystal substrate.

4. The method according to claim 3, wherein the cooling of the InP single crystal ingot comprises moving a growth crucible away from a heating portion of a heater.

5. The method according to claim 3, wherein the cooling of the InP single crystal ingot further comprises moving the growth crucible down to the lowermost portion in a furnace in order to move the crucible away from the heating portion of the heater.

6. The method according to claim 3, further comprising pulling up the Zn-doped InP single crystal ingot in a furnace by a liquid encapsulated Czochralski method, the furnace comprising a thermal baffle, the thermal baffle having a structure in which a conical cylinder is directly connected to an upper wall of a straight body-shaped cylinder made of graphite and having a thickness of from 3 to 6 mm.

7. The method according to claim 6, wherein the cooling of the InP single crystal ingot further comprises cooling the InP single crystal ingot on an inner side of the thermal baffle and without bringing the InP single crystal ingot into contact with the thermal baffle, while rotating the InP single crystal ingot, after pulling up the InP single crystal ingot by the LEC method.

* * * * *